US010340370B2

(12) United States Patent
Wang et al.

(10) Patent No.: US 10,340,370 B2
(45) Date of Patent: Jul. 2, 2019

(54) ASYMMETRIC GATED FIN FIELD EFFECT TRANSISTOR (FET) (FINFET) DIODES

(71) Applicant: QUALCOMM Incorporated, San Diego, CA (US)

(72) Inventors: Hao Wang, San Diego, CA (US); Haining Yang, San Diego, CA (US); Xiaonan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/371,512

(22) Filed: Dec. 7, 2016

(65) Prior Publication Data
US 2018/0158935 A1 Jun. 7, 2018

(51) Int. Cl.
H01L 29/739 (2006.01)
H01L 27/02 (2006.01)
H01L 29/08 (2006.01)
H01L 29/66 (2006.01)
(Continued)

(52) U.S. Cl.
CPC ...... H01L 29/7391 (2013.01); H01L 27/0255 (2013.01); H01L 29/083 (2013.01); H01L 29/0834 (2013.01); H01L 29/66356 (2013.01); H01L 29/0847 (2013.01); H01L 29/495 (2013.01); H01L 29/7851 (2013.01)

(58) Field of Classification Search
CPC ........... H01L 29/7391; H01L 29/66356; H01L 29/0847; H01L 27/0255; H01L 27/0266
See application file for complete search history.

(56) References Cited

U.S. PATENT DOCUMENTS 5,475,245 A * 12/1995 Kudo ................. H01L 29/7391
257/288
6,380,570 B1 4/2002 Voldman
6,404,269 B1 6/2002 Voldman
(Continued)

OTHER PUBLICATIONS

Thijs, Steven et al., "Advanced ESD Power Clamp Design for SOI CMOS Technology," 2010 IEEE International Conference on IC Design and Technology (ICICDT), Jun. 2010, Grenoble, France, 4 pages.
(Continued)

Primary Examiner — Laura M Menz
Assistant Examiner — Candice Chan
(74) Attorney, Agent, or Firm — Withrow & Terranova, PLLC

(57) ABSTRACT

Asymmetric gated fin field effect transistor (FET) (finFET) diodes are disclosed. In one aspect, an asymmetric gated finFET diode employs a substrate that includes a well region of a first-type and a fin disposed in a direction. A first source/drain region is employed that includes a first-type doped material disposed in the fin having a first length in the direction. A second source/drain region having a second length in the direction larger than the first length is employed that includes a second-type doped material disposed in the fin. A gate region is disposed between the first source/drain region and the second source/drain region and has a third length in the direction that is larger than the first length and larger than the second length. The wider gate region increases a length of a depletion region of the asymmetric gated finFET diode, which reduces current leakage while avoiding increase in area.

19 Claims, 17 Drawing Sheets

(51) Int. Cl.
 *H01L 29/78* (2006.01)
 *H01L 29/49* (2006.01)

(56) References Cited

U.S. PATENT DOCUMENTS

| | | |
|---|---|---|
| 7,919,816 B2 | 4/2011 | Gossner et al. |
| 8,570,698 B2 | 10/2013 | Lee et al. |
| 9,502,410 B1 | 11/2016 | Feng et al. |
| 2002/0086467 A1* | 7/2002 | Chang ................ H01L 27/0255 |
| | | 438/155 |
| 2006/0273372 A1 | 12/2006 | Voldman et al. |
| 2013/0292745 A1 | 11/2013 | Liu et al. |
| 2014/0131765 A1* | 5/2014 | Tsai .................... H01L 27/0255 |
| | | 257/133 |
| 2015/0034909 A1 | 2/2015 | Horch |
| 2016/0190305 A1 | 6/2016 | Jangjian et al. |

OTHER PUBLICATIONS

International Search Report and Written Opinion for PCT/US2017/053373, dated Jan. 9, 2018, 15 pages.
Second Written Opinion for PCT/US2017/053373, dated Nov. 21, 2018, 5 pages.
International Preliminary Report on Patentability for PCT/US2017/053373, dated Feb. 20, 2019, 25 pages.

* cited by examiner

ASYMMETRIC GATED FIN FIELD EFFECT TRANSISTOR (FET) (FINFET) DIODES

BACKGROUND

I. Field of the Disclosure

The technology of the disclosure relates generally to diodes, and more particularly to reducing current leakage in diodes.

II. Background

Electrostatic discharge (ESD) is a common cause of reliability problems in integrated circuits (ICs). ESD is a transient surge in voltage (negative or positive) that can induce a large current in a circuit. To protect circuits against damage from ESD surges, protection schemes attempt to provide a discharge path for both positive and negative ESD surges. Conventional diodes can be employed in ESD protection circuits to clamp the voltage of positive and negative ESD surges to shunt and prevent excessive current from being applied to a protected circuit.

For example, FIG. 1 illustrates an exemplary ESD protection circuit 100 configured to provide ESD protection to a protected circuit 102. The ESD protection circuit 100 is coupled between a voltage rail 104 and a ground rail 106 so as to protect the protected circuit 102 from both positive and negative ESD surges. In this manner, the ESD protection circuit 100 includes a positive surge diode 108 and a negative surge diode 110. The positive surge diode 108 clamps positive voltage on a signal pin 112. In particular, in response to positive ESD surges on the signal pin 112, the positive surge diode 108 is forward-biased and clamps voltage on the signal pin 112 to one diode drop above the voltage rail 104. Energy from such a positive ESD surge is conducted through the positive surge diode 108 in a forward-biased mode and dispersed onto the voltage rail 104. In contrast, the negative surge diode 110 clamps negative voltage on the signal pin 112. More specifically, in response to negative ESD surges on the signal pin 112, the negative surge diode 110 is forward-biased so as to provide a low-impedance path relative to the protected circuit 102. Energy from the negative ESD surge dissipates onto the ground rail 106.

While the ESD protection circuit 100 in FIG. 1 provides protection against ESD surges, various design parameters of the ESD protection circuit 100 can negatively impact corresponding ICs. For example, as the positive and negative surge diodes 108, 110 are scaled down to a node size of ten (10) nanometers (nm) and below, the positive and negative surge diodes 108, 110 experience an increase in current leakage, thus increasing power consumption of the ESD protection circuit 100. The increased power consumption resulting from the higher current leakage can reduce the battery life of a mobile computing device (e.g., a smart phone, tablet, etc.) employing the ESD protection circuit 102. Thus, it would be advantageous to reduce the current leakage corresponding to the positive and negative surge diodes 108, 110 so as to decrease the power consumption of the ESD protection circuit 100.

SUMMARY OF THE DISCLOSURE

Aspects disclosed herein include asymmetric gated fin field effect transistor (FET) (finFET) diodes. In one aspect, an asymmetric gated finFET diode employs a substrate that includes a well region of a first-type (e.g., N-type or P-type) and a fin disposed in a direction. The asymmetric gated finFET diode also employs a first source/drain region having a first length in the direction. The first source/drain region employs a first-type doped material (e.g., N-type or P-type) disposed in the fin. Additionally, a second source/drain region having a second length in the direction larger than the first length is employed. The second source/drain region employs a second-type doped material (e.g., N-type or P-type) disposed in the fin. The asymmetric gated finFET diode also includes a gate region disposed between the first source/drain region and the second source/drain region. The gate region has a third length in the direction that is larger than the first length of the first source/drain region and larger than the second length of the second source/drain region. In this manner, the gate region of the asymmetric gated finFET diode is wider than a gate region of a conventional symmetric diode employing equally sized first source/drain, second source/drain, and gate regions. The wider gate region increases a corresponding channel length, thus increasing the length of a depletion region corresponding to a P/N junction of the asymmetric gated finFET diode. The wider depletion region reduces current leakage compared to a conventional symmetric gated finFET diode. Further, by forming the first source/drain, second source/drain, and gate regions as described above, the asymmetric gated finFET diode can achieve the same area as a conventional symmetric gated finFET diode. Therefore, the asymmetric gated finFET diode achieves a reduced current leakage, and thus reduced power consumption, while avoiding an increase in area.

In this regard in one aspect, an asymmetric gated finFET diode is provided. The asymmetric gated finFET diode comprises a substrate. The substrate comprises a first-type well region and a fin disposed in a direction. The asymmetric gated finFET diode also comprises a first source/drain region having a first length in the direction, wherein the first source/drain region comprises a first-type doped material disposed in the fin. The asymmetric gated finFET diode also comprises a second source/drain region having a second length in the direction that is larger than the first length, wherein the second source/drain region comprises a second-type doped material disposed in the fin. The asymmetric gated finFET diode also comprises a gate region disposed between the first source/drain region and the second source/drain region having a third length in the direction that is larger than the first length and larger than the second length.

In another aspect, an asymmetric gated finFET diode is provided. The asymmetric gated finFET diode comprises a means for providing a substrate. The means for providing a substrate comprises a first-type well region and a fin disposed in a direction. The asymmetric gated finFET diode also comprises a means for providing a first source/drain region having a first length in the direction, wherein the first source/drain region comprises a first-type doped material disposed in the fin. The asymmetric gated finFET diode also comprises a means for providing a second source/drain region having a second length in the direction that is larger than the first length, wherein the second source/drain region comprises a second-type doped material disposed in the fin. The asymmetric gated finFET diode also comprises a means for providing a gate region disposed between the first source/drain region and the second source/drain region having a third length in the direction that is larger than the first length and larger than the second length.

In another aspect, a method of manufacturing an asymmetric gated finFET diode is provided. The method comprises providing a substrate comprising a first-type well region and a fin disposed in a direction. The method also comprises forming a gate region corresponding to the fin, wherein the gate region has a third length in the direction. The method also comprises disposing a first-type doped material in a first source/drain region in the fin, wherein the first source/drain region has a first length in the direction smaller than the third length. The method also comprises disposing a second-type doped material in a second source/drain region in the fin, wherein the second source/drain region has a second length in the direction larger than the first length and smaller than the third length.

In another aspect, an apparatus is provided. The apparatus comprises an electrostatic discharge (ESD) protection circuit. The ESD protection circuit comprises a positive surge diode coupled to a signal pin and a voltage rail. The positive surge diode comprises a substrate comprising an N-type well region and a fin disposed in a direction. The positive surge diode also comprises a first source/drain region having a first length in the direction, wherein the first source/drain region of the positive surge diode comprises an N-type doped material disposed in the fin. The positive surge diode also comprises a second source/drain region having a second length in the direction that is larger than the first length, wherein the second source/drain region of the positive surge diode comprises a P-type doped material disposed in the fin. The positive surge diode also comprises a gate region disposed between the second source/drain region and the first source/drain region of the positive surge diode and having a third length in the direction that is larger than the first length and larger than the second length. The ESD protection circuit also comprises a negative surge diode coupled to the signal pin and a ground rail. The negative surge diode comprises the substrate comprising a P-type well region and a fin disposed in the direction. The negative surge diode also comprises a first source/drain region having the first length in the direction, wherein the first source/drain region of the negative surge diode comprises a P-type doped material disposed in the fin. The negative surge diode also comprises a second source/drain region having the second length in the direction, wherein the second source/drain region of the negative surge diode comprises an N-type doped material disposed in the fin. The negative surge diode also comprises a gate region disposed between the second source/drain region and the first source/drain region of the negative surge diode and having the third length in the direction.

DETAILED DESCRIPTION

Figure 1:
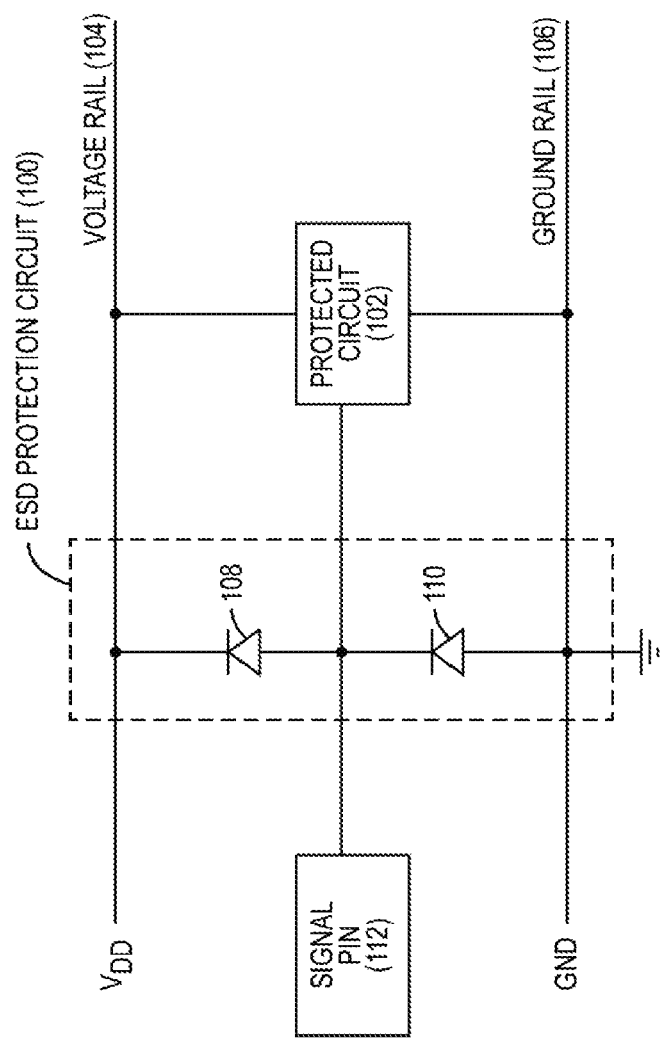
FIG. 1 is a diagram of an exemplary electrostatic discharge (ESD) protection circuit configured to provide ESD protection to a protected circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include asymmetric gated fin field effect transistor (FET) (finFET) diodes. In one aspect, an asymmetric gated finFET diode employs a substrate that includes a well region of a first-type (e.g., N-type or P-type) and a fin disposed in a direction. The asymmetric gated finFET diode also employs a first source/drain region having a first length in the direction. The first source/drain region employs a first-type doped material (e.g., N-type or P-type) disposed in the fin. Additionally, a second source/drain region having a second length in the direction larger than the first length is employed. The second source/drain region employs a second-type doped material (e.g., N-type or P-type) disposed in the fin. The asymmetric gated finFET diode also includes a gate region disposed between the first source/drain region and the second source/drain region. The gate region has a third length in the direction that is larger than the first length of the first source/drain region and larger than the second length of the second source/drain region. In this manner, the gate region of the asymmetric gated finFET diode is wider than a gate region of a conventional symmetric diode employing equally sized first source/drain, second source/drain, and gate regions. The wider gate region increases a corresponding channel length, thus increasing the length of a depletion region corresponding to a P/N junction of the asymmetric gated finFET diode. The wider depletion region reduces current leakage compared to a conventional symmetric gated finFET diode. Further, by forming the first source/drain, second source/drain, and gate regions as described above, the asymmetric gated finFET diode can achieve the same area as a conventional symmetric gated finFET diode. Therefore, the asymmetric gated finFET diode achieves a reduced current leakage, and thus reduced power consumption, while avoiding an increase in area.

Figure 2:
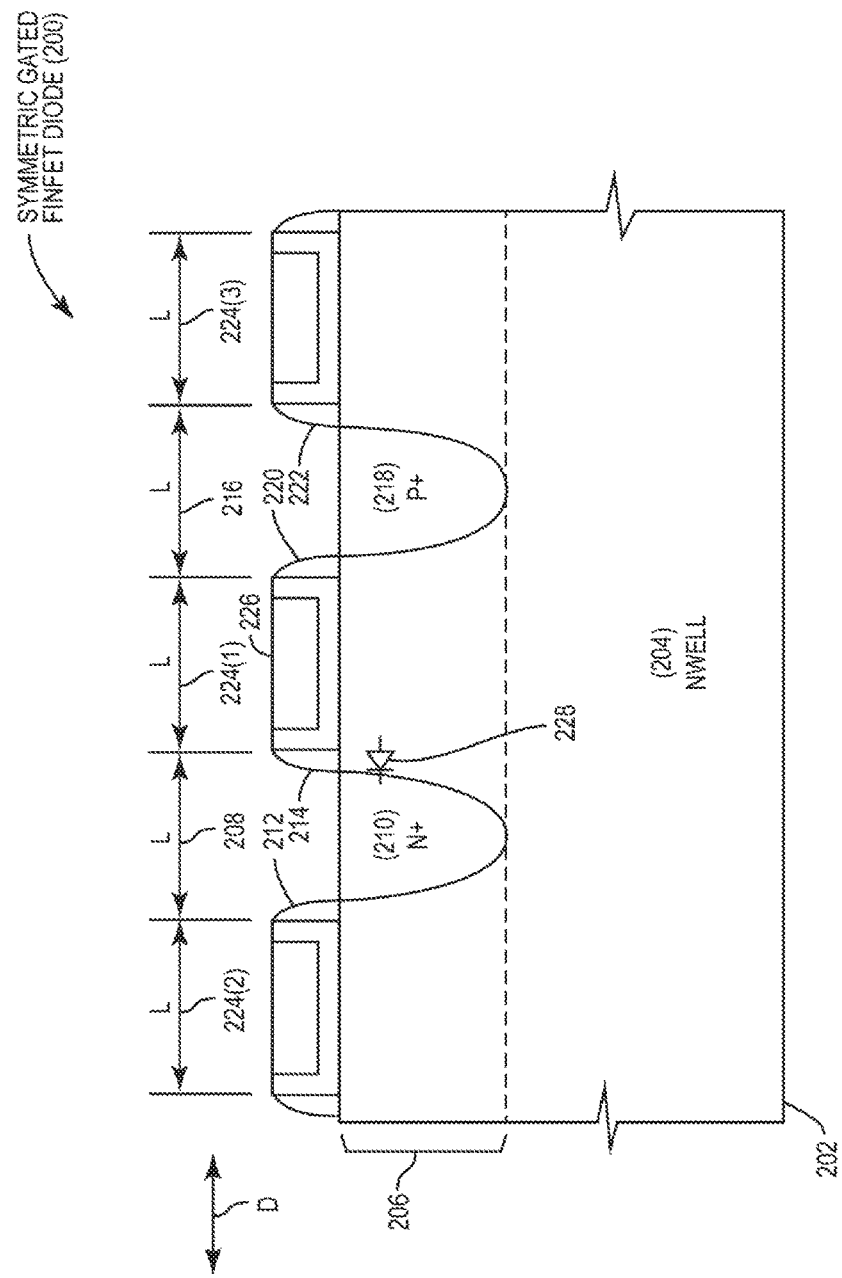
FIG. 2 is a cross-sectional diagram of an exemplary conventional symmetric gated fin Field Effect Transistor (FET) (finFET) diode.

Before addressing exemplary aspects of the present disclosure, details of conventional symmetric gated finFET diodes are first described. In this regard, FIG. 2 is a cross-sectional view of an exemplary conventional symmetric gated finFET diode 200. In this example, the symmetric gated finFET diode 200 employs a substrate 202 that includes an N-type well region 204 and a fin 206 disposed in a direction D. A first source/drain region 208 having a length L in the direction D is employed that includes an N-type doped material 210 (N+) disposed between a first spacer 212 and a second spacer 214. In this manner, the first source/drain region 208 functions as a cathode of the symmetric gated finFET diode 200. Additionally, a second source/drain region 216 having the length L in the direction D is employed that includes a P-type doped material 218 (P+) disposed in the fin 206 between a first spacer 220 and a second spacer 222. In this manner, the second source/drain region 216 functions as an anode of the symmetric gated finFET diode 200. A gate region 224(1) is disposed between the first source/drain region 208 and the second source/drain region 216. Gate regions 224(2), 224(3) can also be employed in the symmetric gated finFET diode 200. Further, the gate region 224(1) has the length L in the direction D and includes a gate 226 disposed over the fin 206. In this manner, the first source/drain region 208, the second source/drain region 216, and the gate region 224(1) of the symmetric gated finFET diode 200 all have the same length L, such that the symmetric gated finFET diode 200 is referred to as "symmetric."

With continuing reference to FIG. 2, the symmetric gated finFET diode 200 experiences current leakage corresponding to a P/N junction 228. One way to reduce such current leakage is by increasing the size of a depletion region (not shown) associated with the P/N junction 228. Increasing the depletion region of the symmetric gated finFET diode 200 includes increasing the length L of the gate region 224(1). However, to maintain symmetry of the symmetric gated finFET diode 200, increasing the length L of the gate region 224(1) results in increasing the length L of the first source/drain and second source/drain regions 208, 216. Thus, reducing the current leakage in this manner increases the area of the symmetric gated finFET diode 200.

Figure 3A:
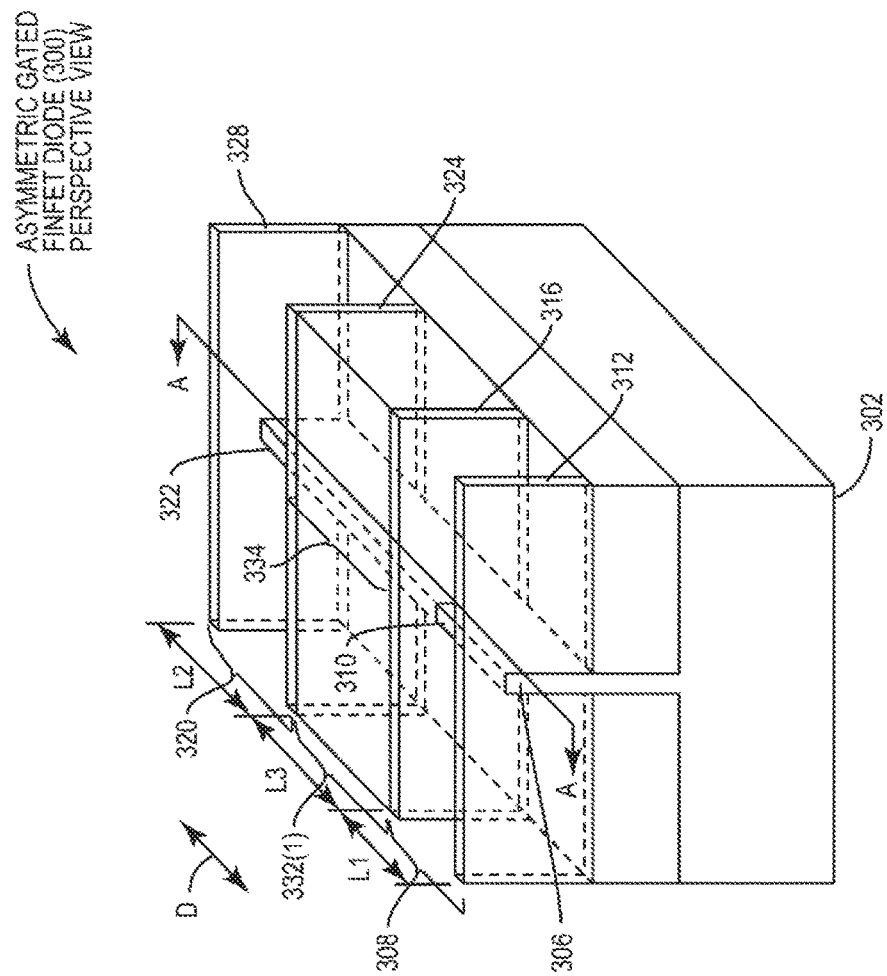
FIG. 3A is a perspective-view diagram of a portion of an exemplary asymmetric gated finFET diode with reduced current leakage compared to the symmetric gated finFET diode of FIG. 2.
Figure 3B:
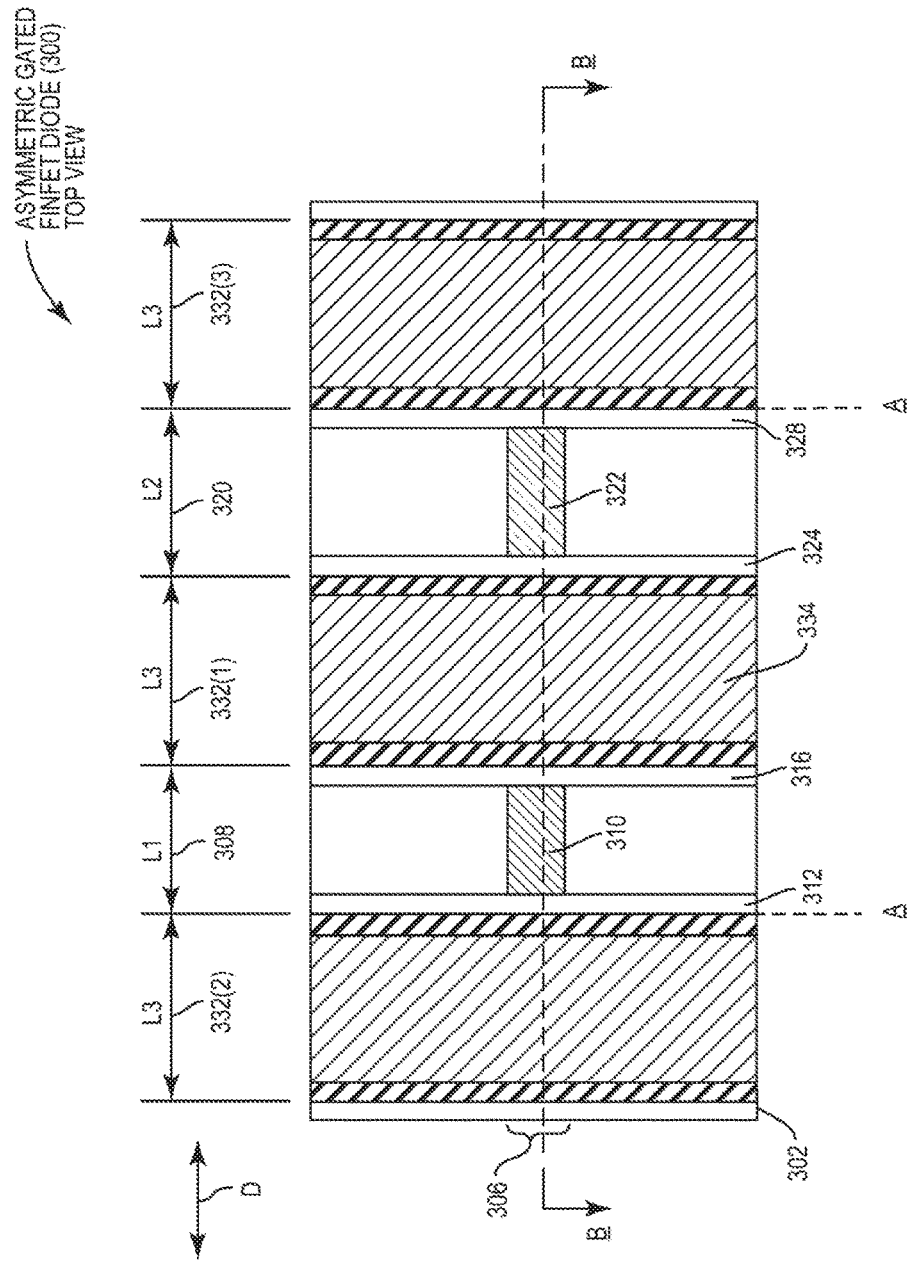
FIG. 3B is a top-view diagram of the asymmetric gated finFET diode of FIG. 3A.
Figure 3C:
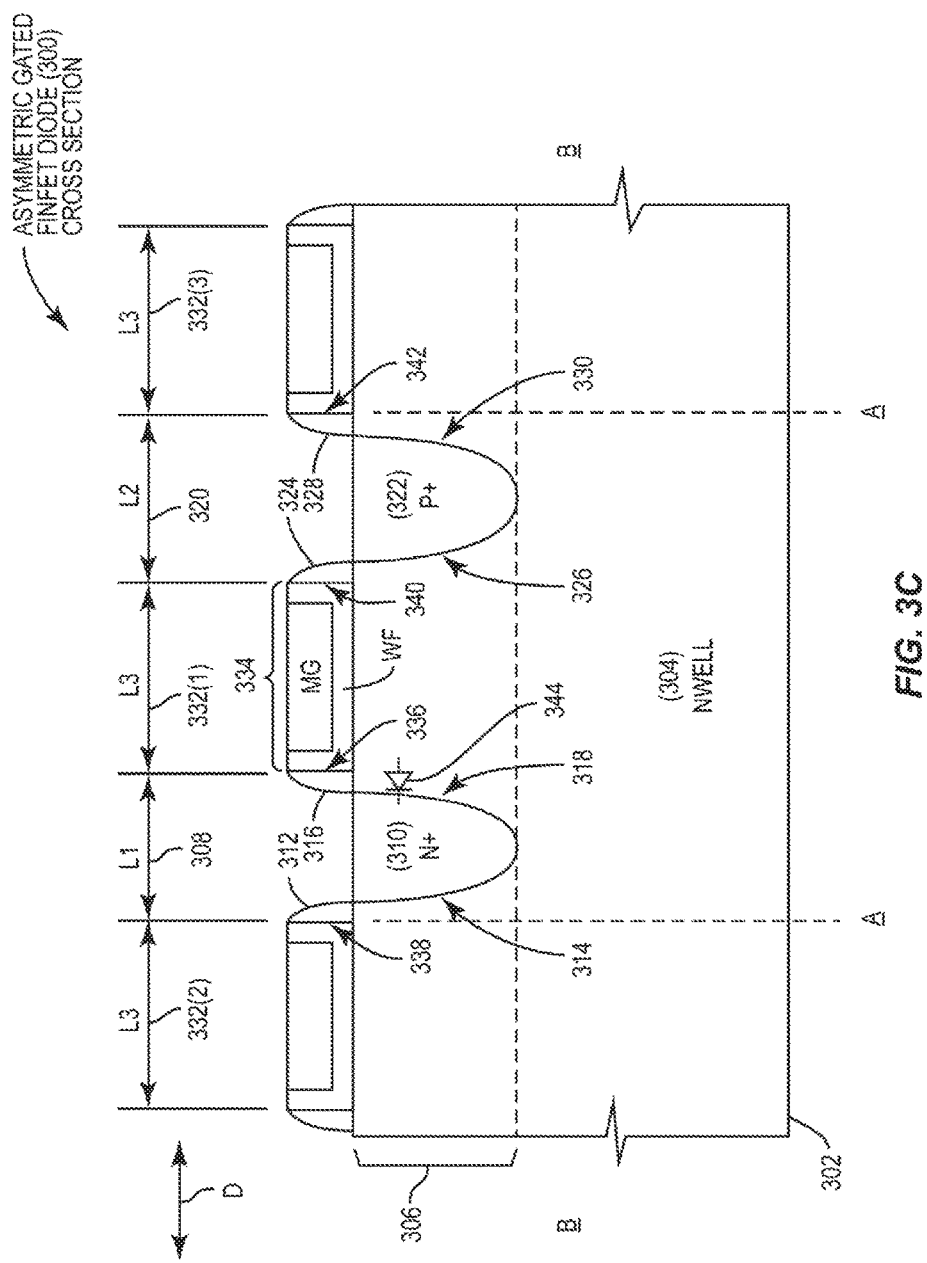
FIG. 3C is a cross-sectional diagram of the asymmetric gated finFET diode of FIG. 3A.

In this regard, FIGS. 3A-3C illustrate an exemplary asymmetric gated finFET diode 300 with reduced current leakage compared to the symmetric gated finFET diode 200 of FIG. 2. FIG. 3A illustrates a perspective-view diagram of a portion of the asymmetric gated finFET diode 300, FIG. 3B illustrates a top-view diagram of the asymmetric gated finFET diode 300, and FIG. 3C illustrates a cross-sectional diagram of the asymmetric gated finFET diode 300. Components of the asymmetric gated finFET diode 300 are referred to with common element numbers in FIGS. 3A-3C.

With continuing reference to FIGS. 3A-3C, the asymmetric gated finFET diode 300 employs a substrate 302 that includes a first-type well region 304 (e.g., N-type or P-type) and a fin 306 disposed in a direction D. In this example, the first-type well region 304 is an N-type well region (NWELL). However, as discussed below, alternative aspects can instead employ a P-type well region. The asymmetric gated finFET diode 300 also employs a first source/drain region 308 having a first length L1 in the direction D. The first source/drain region 308 includes a first-type doped material 310 disposed in the fin 306. As used herein, the first source/drain region 308 can be either a source or a drain region (i.e., a cathode or an anode) according to the first-type doped material 310. For example, the first-type doped material 310 includes an N-type doped material (N+) such that the first source/drain region 308 functions as a cathode of the asymmetric gated finFET diode 300. In this aspect, the first source/drain region 308 also includes a first spacer 312 disposed over the fin 306 and on a first side 314 of the first-type doped material 310, and a second spacer 316 disposed over the fin 306 and on a second side 318 of the first-type doped material 310 different from the first side 314.

With continuing reference to FIGS. 3A-3C, the asymmetric gated finFET diode 300 also employs a second source/drain region 320 having a second length L2 in the direction D that is larger than the first length L1. In particular, the second source/drain region 320 includes a second-type doped material 322 disposed in the fin 306. As used herein, the second source/drain region 320 can be either a source or a drain region (i.e., a cathode or an anode) according to the second-type doped material 322. For example, the second-type doped material 322 includes a P-type doped material (P+) such that the second source/drain region 320 functions as an anode of the asymmetric gated finFET diode 300. In this aspect, the second source/drain region 320 also includes a first spacer 324 disposed over the fin 306 and on a first side 326 of the second-type doped material 322, and a second spacer 328 disposed over the fin 306 and on a second side 330 different from the first side 326 of the second-type doped material 322.

With continuing reference to FIGS. 3A-3C, the asymmetric gated finFET diode 300 also includes a gate region 332(1) having a third length L3 in the direction D disposed between the first source/drain region 308 and the second source/drain region 320. Although not employed in every aspect, the asymmetric gated finFET diode 300 also employs gate regions 332(2), 332(3) having the third length L3. In this aspect, the gate region 332(1) also employs a gate 334 (e.g., a metal gate MG disposed over a work function layer WF) disposed over the fin 306. The third length L3 is larger than the first length L1 of the first source/drain region 308 and larger than the second length L2 of the second source/drain region 320. In this aspect, the first length L1 is a distance from a side 336 of the gate region 332(1) to a side 338 of the first source/drain region 308. The second length L2 is a distance from a side 340 of the gate region 332(1) to a side 342 of the second source/drain region 320. Additionally, the third length L3 is the distance between the sides 336, 340 of the gate region 332(1). Further, it is worth noting that as used herein, the first, second, and third lengths L1, L2, L3 do not refer to a channel length dimension of the asymmetric gated finFET diode 300.

With continuing reference to FIGS. 3A-3C, as a non-limiting example, the third length L3 is approximately equal to the second length L2 plus the difference of the second length L2 and the first length L1 (i.e., L3=L2+(L2−L1)). For example, if the asymmetric gated finFET diode 300 is fabricated using a ten (10) nanometer (nm) process technology, the first length L1 may be approximately equal to ten (10) nm less than the second length L2, and the third length L3 may be approximately equal to ten (10) nm greater than the second length L2. One of ordinary skill in the art would understand the term "approximately equal" to be defined as equal or almost equal. Further, in addition to the dimensions of the previous example, one of ordinary skill in the art would understand other dimensions to fall within the scope of aspects described herein. Employing the first source/drain region 308, the second source/drain region 320, and the gate region 332(1) with the varying first, second, and third lengths L1, L2, L3, respectively, results in the asymmetric gated finFET diode 300 being referred to as "asymmetric." Further, the gate region 332(1) of the asymmetric gated finFET diode 300 is wider than the gate region 224(1) of the symmetric gated finFET diode 200 of FIG. 2 employing equally sized first source/drain, second source/drain, and gate regions 208, 216, and 224(1).

With continuing reference to FIGS. 3A-3C, the wider gate region 332(1) increases a corresponding channel length, thus increasing the length of a depletion region (not shown) corresponding to a P/N junction 344 of the asymmetric gated finFET diode 300. The wider depletion region reduces current leakage compared to the symmetric gated finFET diode 200 of FIG. 2. In this manner, the reduced current leakage reduces power consumption and also provides the asymmetric gated finFET diode 300 with a greater margin to account for current leakage changes associated with threshold voltage tuning and/or process variations. Further, by forming the first source/drain, second source/drain, and gate regions 308, 320, and 332(1) as described above, the asymmetric gated finFET diode 300 can achieve the same area as the symmetric gated finFET diode 200 of FIG. 2. Thus, the asymmetric gated finFET diode 300 achieves a reduced current leakage, and thus reduced power consumption, while avoiding an increase in area.

Figure 4:
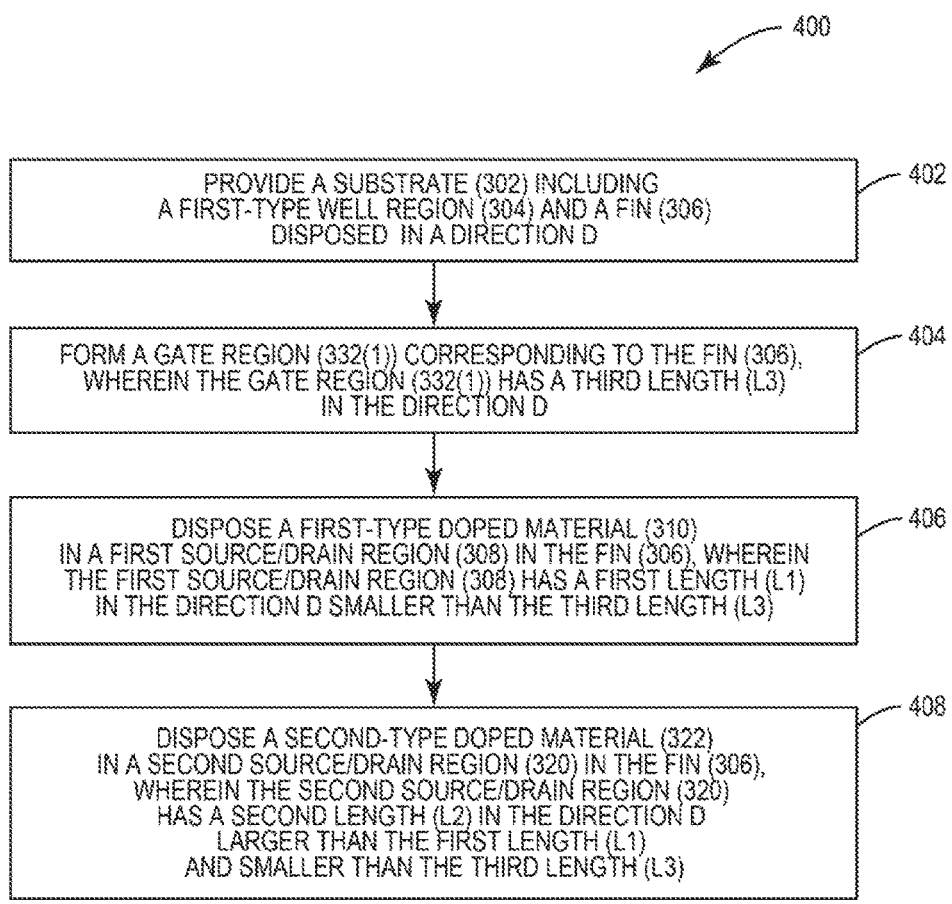
FIG. 4 is a flowchart illustrating an exemplary process for fabricating the asymmetric gated finFET diode of FIGS. 3A-3C.

FIG. 4 illustrates an exemplary fabrication process 400 employed to fabricate the asymmetric gated finFET diode 300 of FIGS. 3A-3C. Further, FIGS. 5A-5E provide cross-sectional diagrams illustrating the asymmetric gated finFET diode 300 during the various steps of the fabrication process 400. The cross-sectional diagrams illustrating the asymmetric gated finFET diode 300 in FIGS. 5A-5E will be discussed in conjunction with the discussion of the exemplary fabrication steps in the fabrication process 400 in FIG. 4.

Figure 5A:
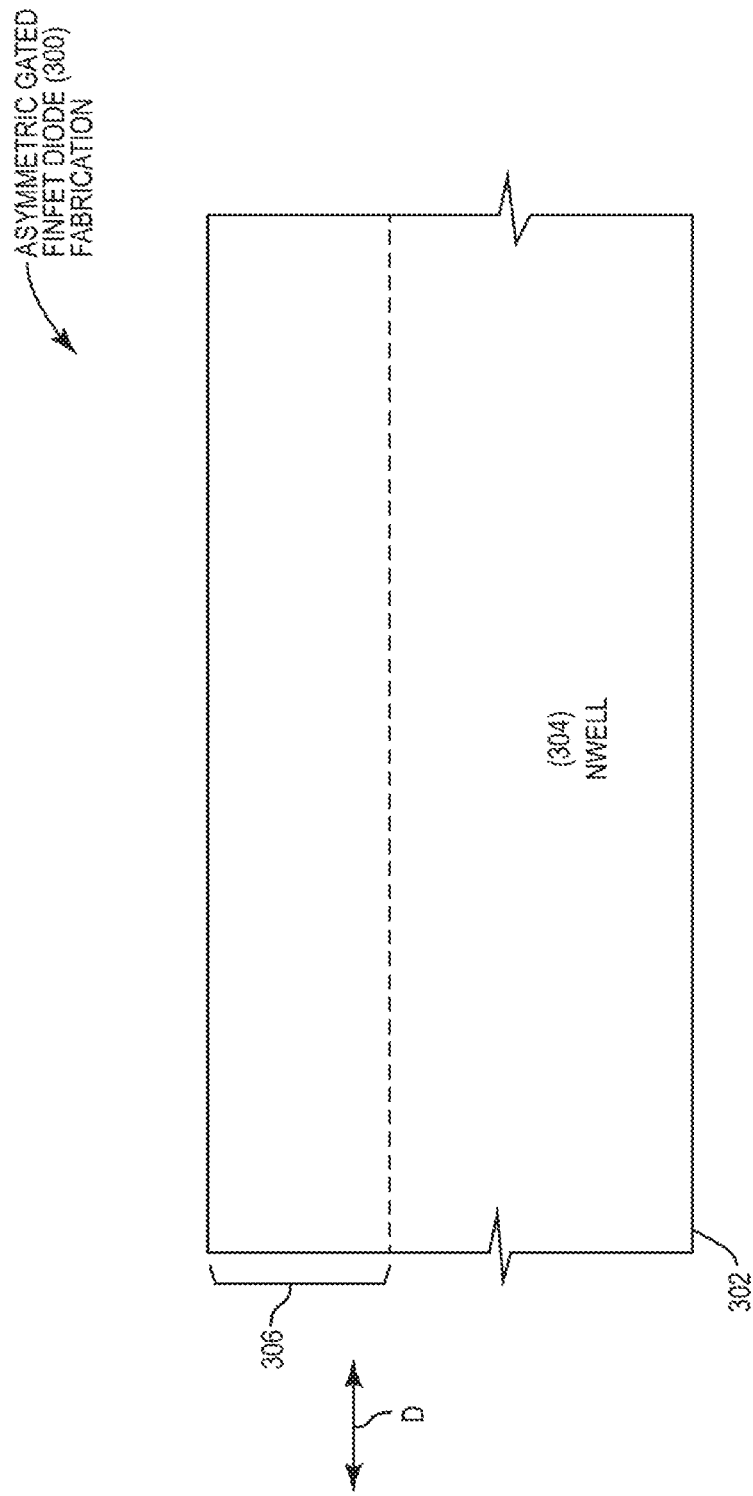
FIGS. 5A-5E are cross-sectional diagrams illustrating the asymmetric gated finFET diode in FIGS. 3A-3C at each step in the process of fabrication in FIG. 4.
Figure 5B:
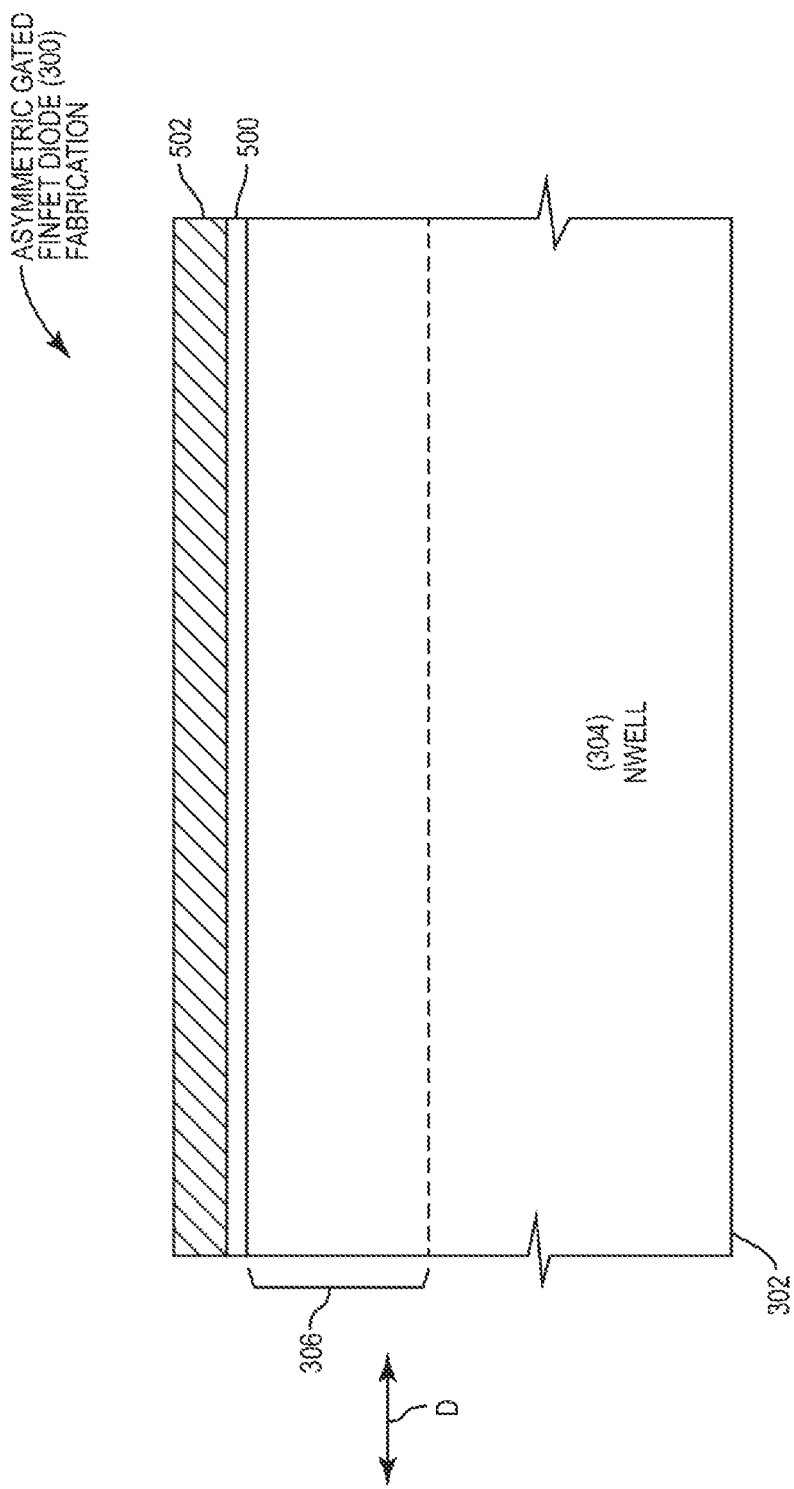
Figure 5C:
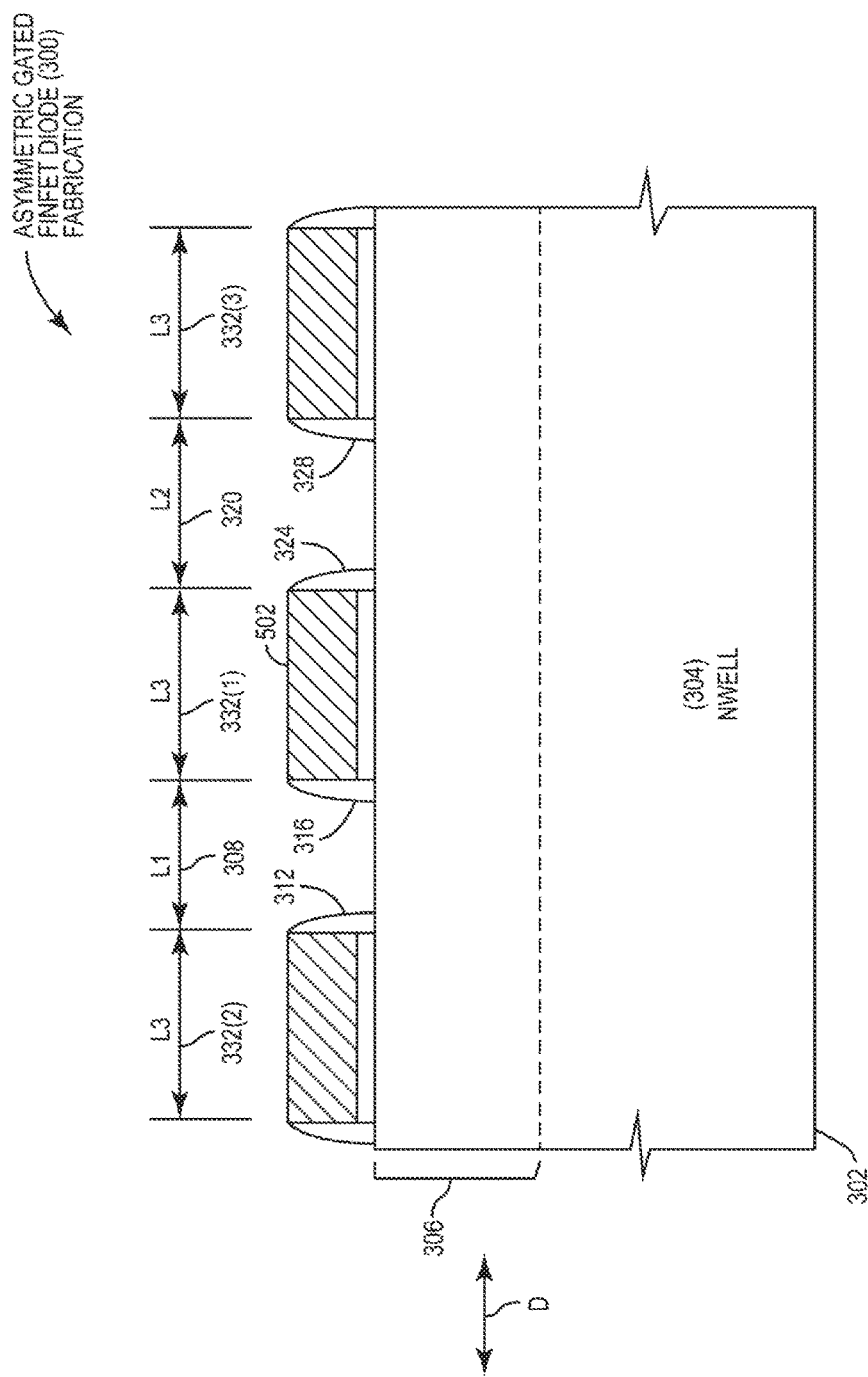
Figure 5D:
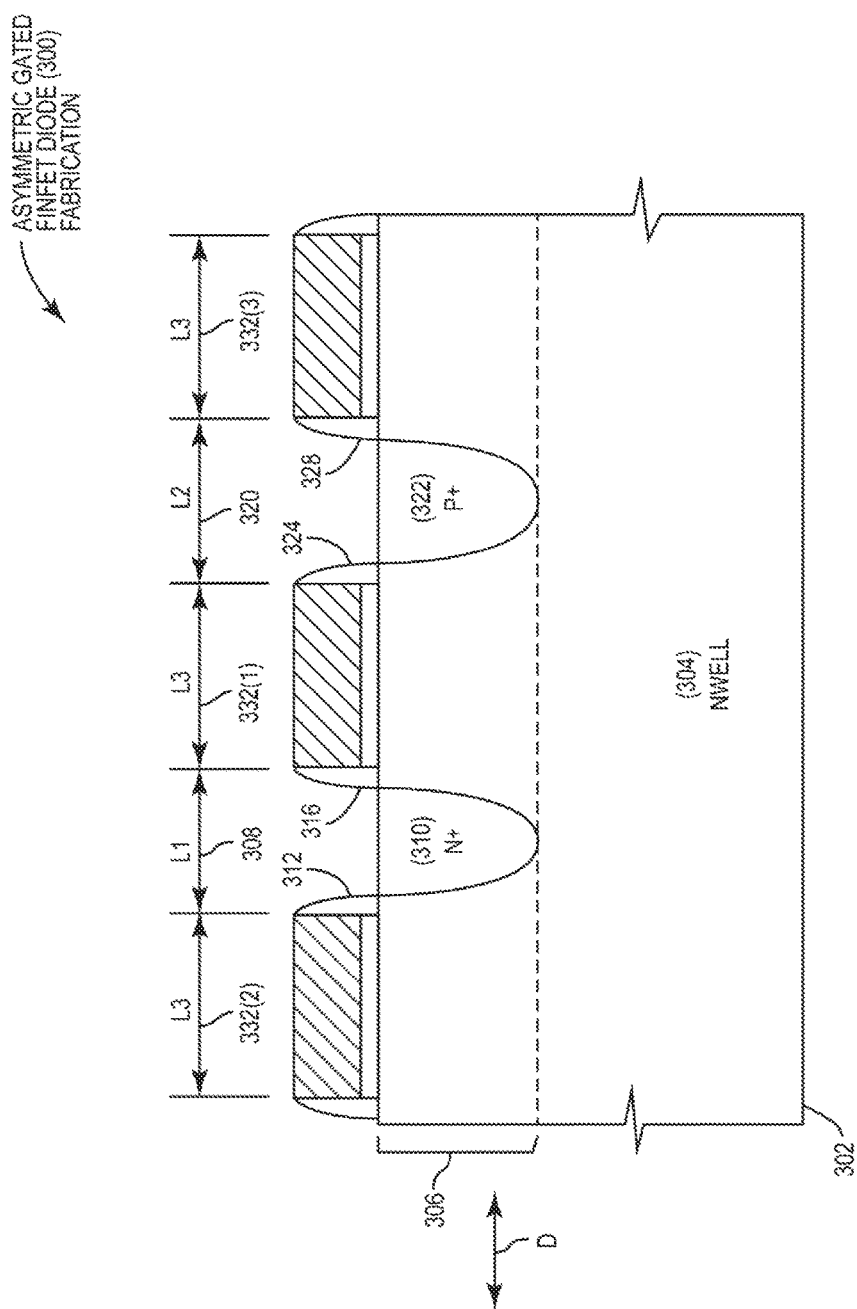
Figure 5E:
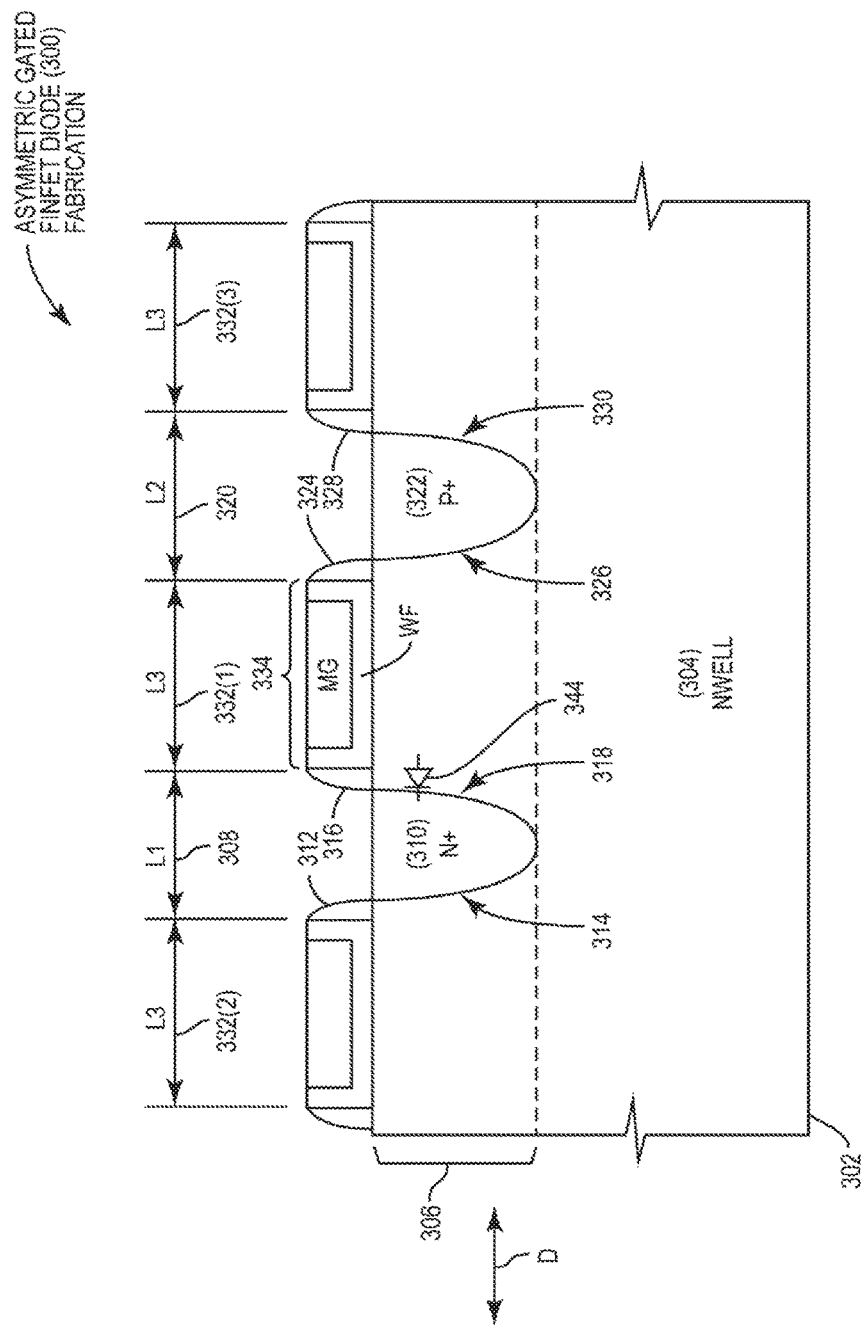

In this regard, the fabrication process 400 in FIG. 4 includes providing the substrate 302 that employs the first-type well region 304 and the fin 306 disposed in the direction D, as illustrated in FIG. 5A (block 402). The fabrication process 400 also includes forming the gate region 332(1) corresponding to the fin 306 such that the gate region 332(1) has the third length L3 in the direction D (block 404). For example, as illustrated in FIG. 5B, forming the gate region 332(1) in block 404 can include disposing a gate oxide 500 over the fin 306, and disposing a polysilicon layer 502 over the gate oxide 500. Additionally, as illustrated in FIG. 5C, forming the gate region 332(1) in block 404 can include etching the gate oxide 500 and the polysilicon layer 502 corresponding to the gate region 332(1), and disposing the first and second spacers 312, 316 corresponding to the first source/drain region 308, as well as the first and second spacers 324, 328 corresponding to the second source/drain region 320. Further, in this aspect, the fabrication process 400 can include etching the gate oxide 500 and the polysilicon layer 502 to form the gate regions 332(2), 332(3). As illustrated in FIG. 5D, the fabrication process 400 also includes disposing the first-type doped material 310 of the first source/drain region 308 in the fin 306 (block 406). As previously described, the first source/drain region 308 has the first length L1 in the direction D that is smaller than the third length L3. Further, as also illustrated in FIG. 5D, the fabrication process 400 includes disposing the second-type doped material 322 in the second source/drain region 320 in the fin 306 (block 408). As previously described, the second source/drain region 320 has the second length L2 in the direction D that is larger than the first length L1 and smaller than the third length L3. In this example, as illustrated in FIG. 5E, the gate oxide 500 and the polysilicon layer 502 corresponding to the gate region 332(1) can be replaced with the gate 334 (e.g., a metal gate MG disposed over a work function layer WF).

Figure 6:
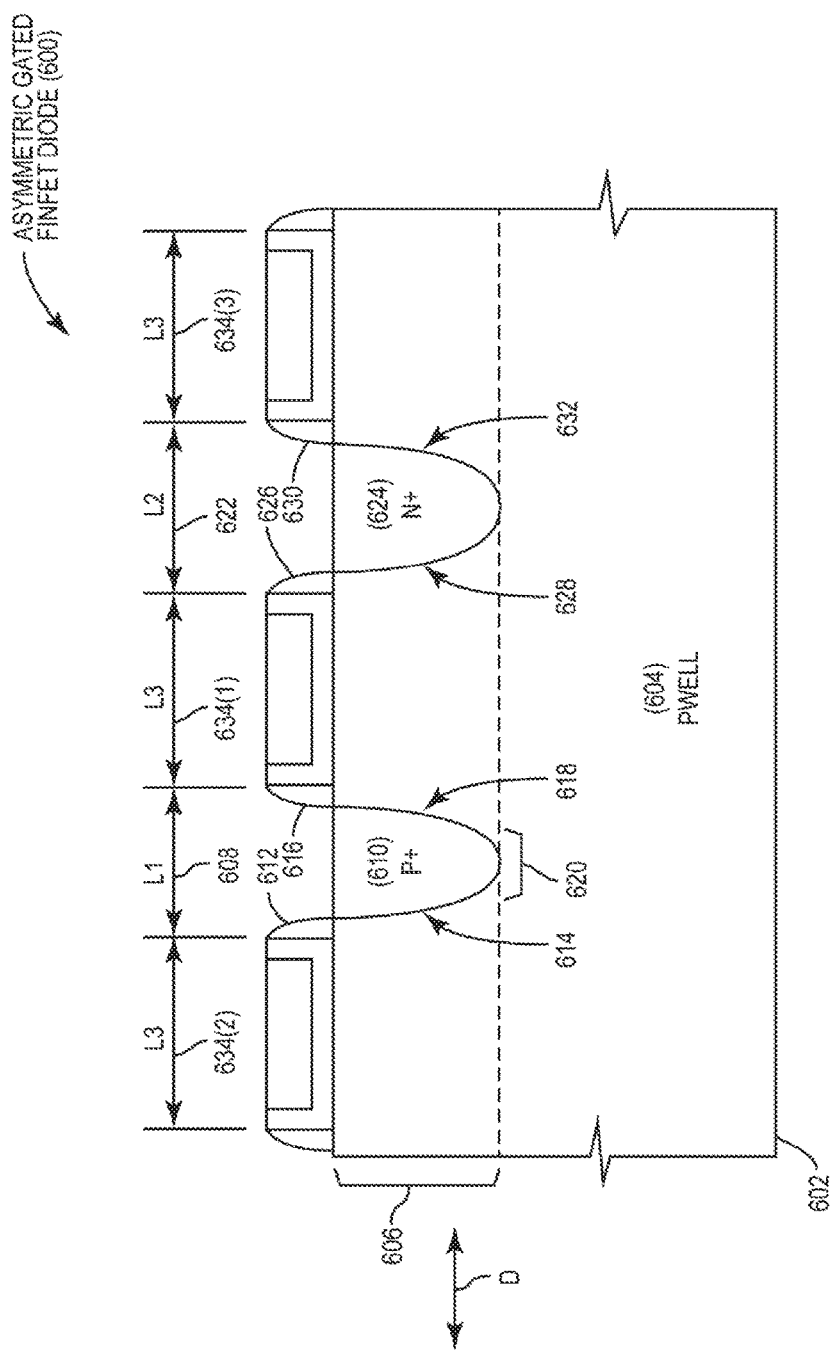
FIG. 6 is a cross-sectional diagram of another exemplary asymmetric gated finFET diode with reduced leakage compared to the symmetric gated finFET diode of FIG. 2.

While the asymmetric gated finFET diode 300 of FIGS. 3A-3C employs the N-type material well region (NWELL), other aspects of the asymmetric gated finFET diode 300 may instead employ a P-type material well region. In this regard, FIG. 6 is a cross-sectional view of an exemplary asymmetric gated finFET diode 600 employing a substrate 602 that includes a first-type well region 604 employed as a P-type well region (PWELL), as well as a fin 606 disposed in a direction D. Similar to the asymmetric gated finFET diode 300 of FIGS. 3A-3C, the asymmetric gated finFET diode 600 also includes a first source/drain region 608 having a first length L1 in the direction D. As a non-limiting example, the first length L1 may be approximately equal to a ground rule minimum length of the process technology used to fabricate the asymmetric gated finFET diode 600. As used herein, the minimum ground rule length represents the minimum spacing allowed between gates in a particular process technology. Thus, setting the first length L1 approximately equal to the ground rule minimum length helps to minimize area of the asymmetric gated finFET diode 600. Additionally, the first source/drain region 608 employs a first-type doped material 610 disposed in the fin 606. The first-type doped material 610 in this example includes a P-type doped material (P+) such that the first source/drain region 608 functions as an anode of the asymmetric gated finFET diode 600. In this aspect, the first source/drain region 608 also includes a first spacer 612 disposed over the fin 606 and on a first side 614 of the first-type doped material 610, and a second spacer 616 disposed over the fin 606 and on a second side 618 of the first-type doped material 610 different from the first side 614.

With continuing reference to FIG. 6, in this aspect, the asymmetric gated finFET diode 600 includes a bulk doped plug 620 disposed under the first source/drain region 608. More specifically, the bulk doped plug 620 includes the first-type doped material 610. Thus, the bulk doped plug 620 increases the conductive area to the first source/drain region 608, which reduces resistance of the first source/drain region 608. In this manner, the bulk doped plug 620 can be configured to reduce the resistance such that the asymmetric gated finFET diode 600 achieves a particular current-resistance (IR) drop (i.e., voltage drop).

With continuing reference to FIG. 6, the asymmetric gated finFET diode 600 also includes a second source/drain region 622 having a second length L2 in the direction D. The second source/drain region 622 employs a second-type doped material 624 disposed in the fin 606. The second-type doped material 624 in this example includes an N-type doped material (N+) such that the second source/drain region 622 functions as a cathode of the asymmetric gated finFET diode 600. In this aspect, the second source/drain region 622 also includes a first spacer 626 disposed over the fin 606 and on a first side 628 of the second-type doped material 624, and a second spacer 630 disposed over the fin 606 and on a second side 632 different from the first side 628 of the second-type doped material 624.

With continuing reference to FIG. 6, the asymmetric gated finFET diode 600 also includes a gate region 634(1) disposed between the first source/drain region 608 and the second source/drain region 622 and having a third length L3. Similar to the gate regions 332(2), 332(3), the asymmetric gated finFET diode 600 can also employ gate regions 634(2), 634(3) having the third length L3 in the direction D. The third length L3 is larger than the first length L1 and larger than the second length L2. Thus, similar to the asymmetric gated finFET diode 300 of FIGS. 3A-3C, the gate region 634(1) of the asymmetric gated finFET diode 600 is wider than the gate region 224(1) of the symmetric gated finFET diode 200 of FIG. 2 employing equally sized first source/drain, second source/drain, and gate regions 208, 216, and 224(1). In this manner, the asymmetric gated finFET diode 600 can achieve the same footprint as the symmetric gated finFET diode 200 of FIG. 2 so as to achieve a reduced current leakage without an increase in area. Further, it is worth noting that while the asymmetric gated finFET diodes 300, 600 in FIGS. 3, 6 each respectively employ the first source/drain region 308, 608, the second source/drain region 320, 622, and the gate region 332(1), 634(1), other aspects can achieve similar functionality when employing multiple first source/drain, second source/drain, and gate regions.

Figure 7:
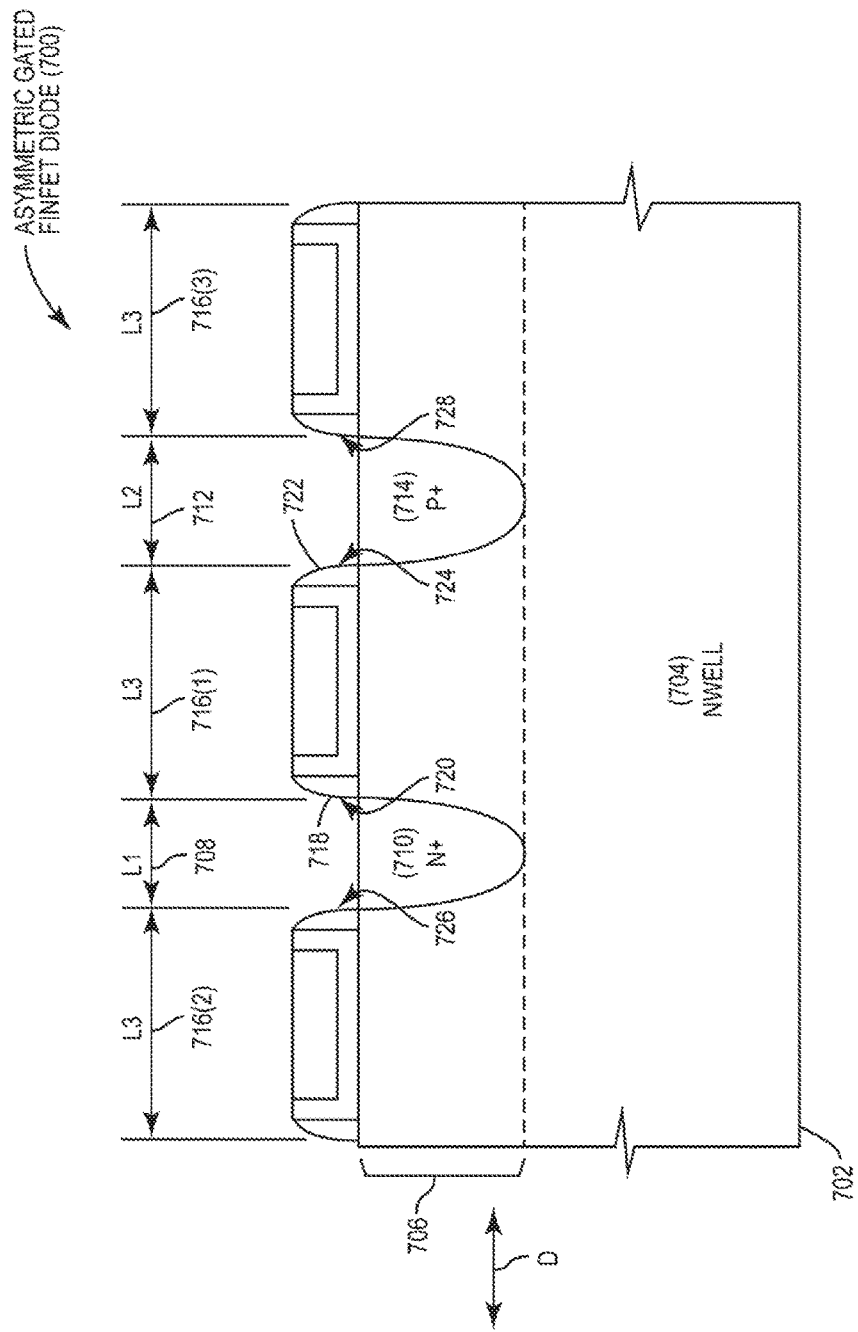
FIG. 7 is a cross-sectional diagram of another exemplary asymmetric gated finFET diode with reduced leakage compared to the symmetric gated finFET diode of FIG. 2.

In addition to the asymmetric gated finFET diode 300 of FIGS. 3A-3C and the asymmetric gated finFET diode 600 of FIG. 6 described above, other aspects may define certain regions differently while achieving similar results. In this regard, FIG. 7 illustrates a cross-sectional view of an exemplary asymmetric gated finFET diode 700 that employs a substrate 702 including a first-type well region 704 (e.g., N-type or P-type) and a fin 706 disposed in a direction D. In this example, the first-type well region 704 is an N-type well region (NWELL). The asymmetric gated finFET diode 700 also employs a first source/drain region 708 having a first length L1 in the direction D that includes a first-type doped material 710 disposed in the fin 706. For example, the first-type doped material 710 includes an N-type doped material (N+) such that the first source/drain region 708 functions as a cathode of the asymmetric gated finFET diode 700. The asymmetric gated finFET diode 700 also employs a second source/drain region 712 having a second length L2 in the direction D that is larger than the first length L1. In particular, the second source/drain region 712 includes a second-type doped material 714 disposed in the fin 706. For example, the second-type doped material 714 includes a P-type doped material (P+) such that the second source/drain region 712 functions as an anode of the asymmetric gated finFET diode 700.

With continuing reference to FIG. 7, the asymmetric gated finFET diode 700 also employs a gate region 716(1) having a third length L3 in the direction D disposed between the first source/drain region 708 and the second source/drain region 712. The third length L3 is larger than the first length L1 and larger than the second length L2. The asymmetric gated finFET diode 700 also employs gate regions 716(2), 716(3) having the third length L3. The gate region 716(1) employs a first spacer 718 disposed over the fin 706 and adjacent to a side 720 of the first source/drain region 708. The gate region 716(1) also employs a second spacer 722 disposed over the fin 706 and adjacent to a side 724 of the second source/drain region 712. In this aspect, the first length L1 is a distance from the side 720 of the first source/drain region 708 to a side 726 of the first source/drain region 708. The second length L2 is a distance from the side 724 of the second source/drain region 712 to a side 728 of the second source/drain region 712. Additionally, the third length L3 is the distance between the side 720 of the first source/drain region 708 and the side 724 of the second source/drain region 712. Even though the asymmetric gated finFET diodes 300, 700 in FIGS. 3A-3C and 7, respectively, define the first, second, and third lengths L1, L2, and L3 differently, each aspect still achieves a reduced current leakage, and thus reduced power consumption, while avoiding an increase in area compared to the symmetric gated finFET diode 200 in FIG. 2.

Figure 8A:
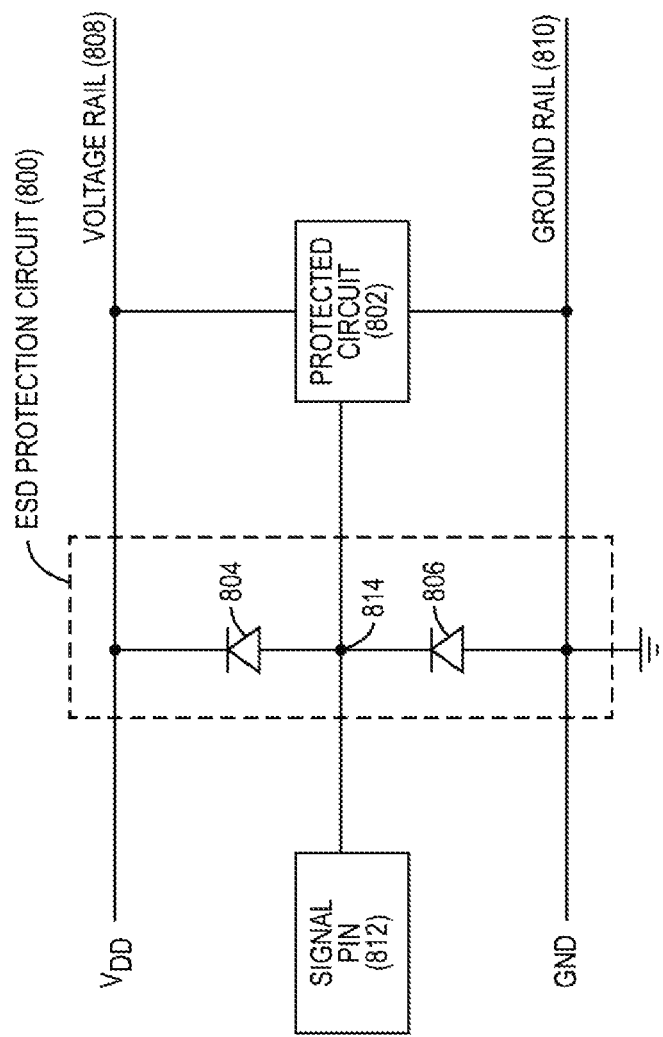
FIG. 8A is a diagram of an exemplary ESD protection circuit configured to provide ESD protection to a protected circuit, wherein the ESD protection circuit employs asymmetric gated finFET diodes.
Figure 8B:
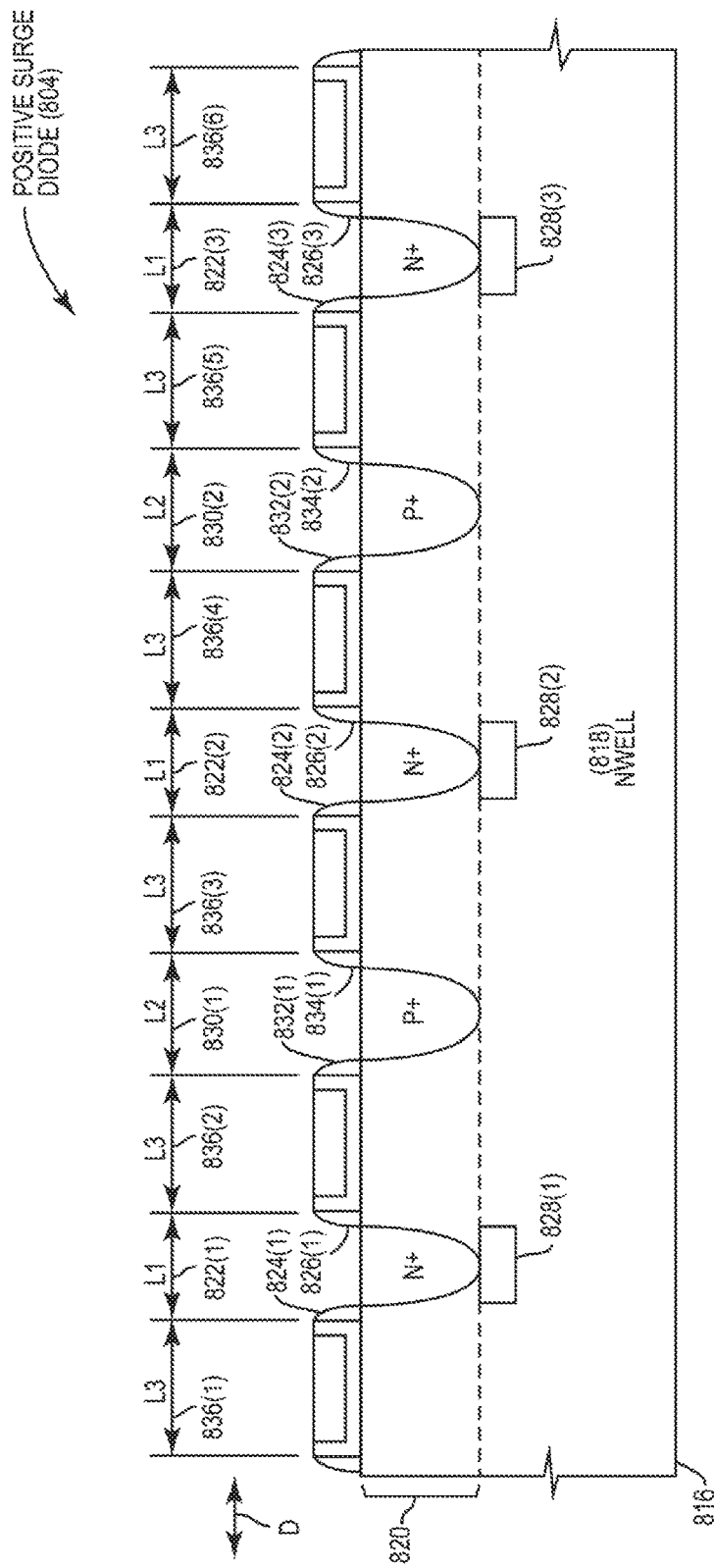
FIG. 8B is a cross-sectional diagram of an exemplary asymmetric gated finFET diode configured to function as a positive surge diode in the ESD protection circuit of FIG. 8A.
Figure 8C:
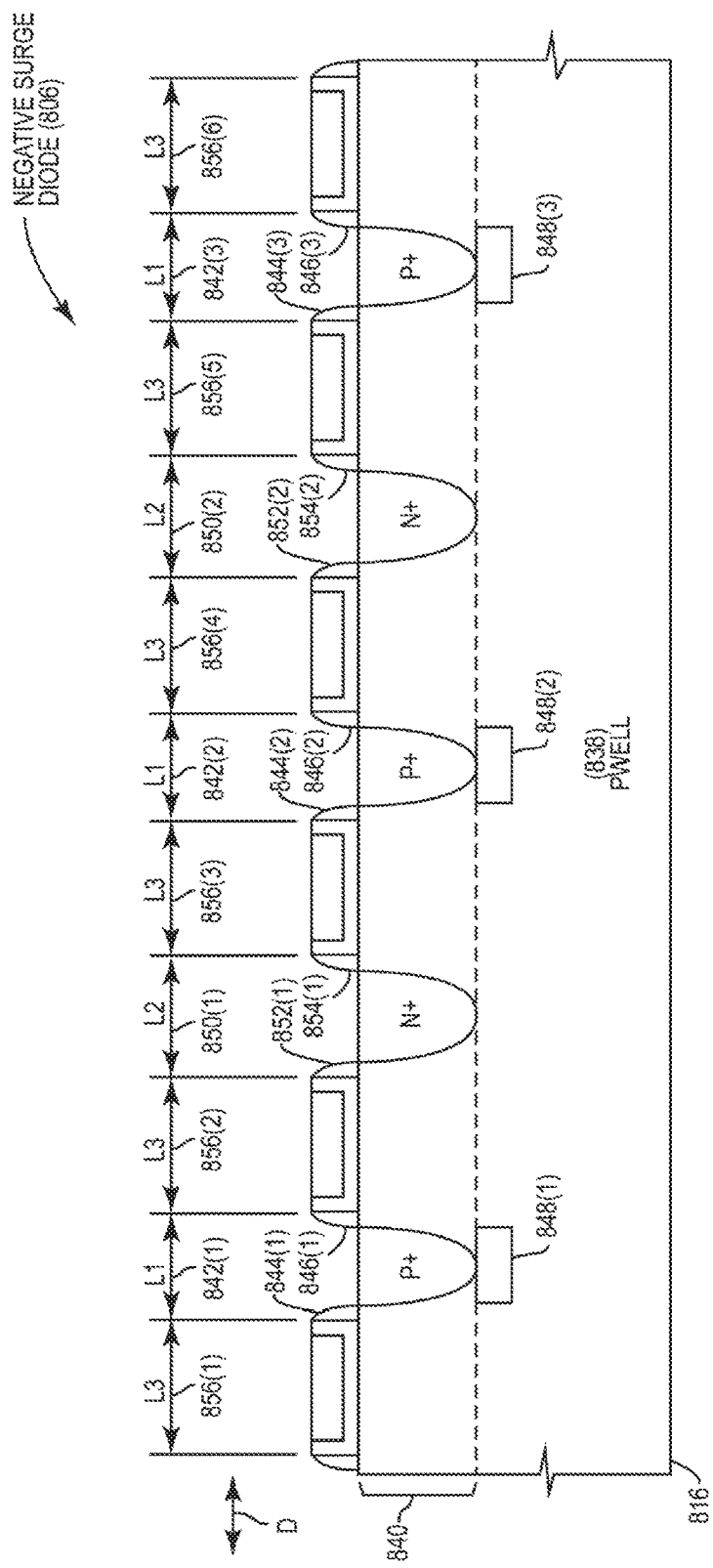
FIG. 8C is a cross-sectional diagram of an exemplary asymmetric gated finFET diode configured to function as a negative surge diode in the ESD protection circuit of FIG. 8A.

Additionally, due to the reduced current leakage of the asymmetric gated finFET diodes of aspects described herein, employing such diodes can reduce the power consumption of corresponding circuits. As a non-limiting example, FIG. 8A illustrates a circuit diagram of an exemplary electrostatic discharge (ESD) protection circuit 800 configured to provide ESD protection to a protected circuit 802. The ESD protection circuit 800 employs asymmetric gated finFET diodes such as, but not limited to, the asymmetric gated finFET diodes 300, 600, 700 in FIGS. 3, 6, and 7, respectively, to reduce current leakage. In particular, as illustrated in FIGS. 8B and 8C below, the ESD protection circuit 800 employs asymmetric gated finFET diodes configured to function as a positive surge diode 804 and a negative surge diode 806. The ESD protection circuit 800 is coupled between a voltage rail 808 and a ground rail 810 so as to protect the protected circuit 802 from both positive and negative ESD surges. A signal pin 812 is configured to convey a voltage signal to the protected circuit 802. In this manner, in response to positive ESD surges on the signal pin 812, the positive surge diode 804 is configured to enter a forward-biased mode and clamp voltage on the signal pin 812 to one diode drop above the voltage rail 808. Energy from such a positive ESD surge is conducted through the positive surge diode 804 in the forward-biased mode via a node 814 and is dispersed onto the voltage rail 808. In contrast, in response to negative ESD surges on the signal pin 812, the negative surge diode 806 is configured to enter a forward-biased mode so as to provide a low-impedance path relative to the protected circuit 802. Energy from the negative ESD surge dissipates via the node 814 onto the ground rail 810.

In this regard, FIG. 8B is a cross-sectional diagram of an exemplary structure of the positive surge diode 804 of FIG. 8A. In particular, the positive surge diode 804 is an asymmetric gated finFET diode 804 that includes a substrate 816 employing an N-type well region 818 and a fin 820 disposed in a direction D. Additionally, the positive surge diode 804 employs first source/drain regions 822(1)-822(3), each of which has a first length L1 in the direction D. Each first source/drain region 822(1)-822(3) employs an N-type doped material (N+) disposed in the fin 820. In this manner, each first source/drain region 822(1)-822(3) functions as a cathode of the positive surge diode 804, and thus, is electrically coupled to the voltage rail 808. In this aspect, each first source/drain region 822(1)-822(3) also includes a corresponding first spacer 824(1)-824(3) and a corresponding second spacer 826(1)-826(3) similar to the asymmetric gated finFET diode 300 of FIGS. 3A-3C. Additionally, in this aspect, the positive surge diode 804 also includes a bulk doped plug 828(1)-828(3) disposed in the N-type well region 818 and under each corresponding first source/drain region 822(1)-822(3). More specifically, each bulk doped plug 828(1)-828(3) includes the N-type doped material (N+). Thus, each bulk doped plug 828(1)-828(3) adds conductive area to the corresponding first source/drain region 822(1)-822(3), which reduces resistance corresponding to each first source/drain region 822(1)-822(3).

With continuing reference to FIG. 8B, the positive surge diode 804 also includes second source/drain regions 830(1), 830(2), each of which has a second length L2 in the direction D that is larger than the first length L1. Each second source/drain region 830(1), 830(2) employs a P-type doped material (P+) disposed in the fin 820. In this manner, each second source/drain region 830(1), 830(2) functions as an anode of the positive surge diode 804, and thus, is electrically coupled to the node 814. In this aspect, each second source/drain region 830(1), 830(2) also includes a corresponding first spacer 832(1), 832(2) and a corresponding second spacer 834(1), 834(2).

With continuing reference to FIG. 8B, the positive surge diode 804 includes gate regions 836(1)-836(6) having a third length L3 in the direction D that is larger than the first length L1 and larger than the second length L2. In particular, the gate regions 836(2)-836(5) are disposed between corresponding first source/drain regions 822(1)-822(3) and the second source/drain regions 830(1), 830(2). For example, the gate region 836(2) is disposed between the first source/drain region 822(1) and the second source/drain region 830(1). The gate region 836(3) is disposed between the first source/drain region 822(2) and the second source/drain region 830(1). Further, the gate region 836(4) is disposed between the first source/drain region 822(2) and the second source/drain region 830(2). The gate region 836(5) is disposed between the first source/drain region 822(3) and the second source/drain region 830(2). In this example, the gate regions 836(1)-836(6) are not electrically coupled to another circuit element (i.e., floating).

Further, FIG. 8C is a cross-sectional diagram of an exemplary structure of the negative surge diode 806 of FIG. 8A. In particular, the negative surge diode 806 is an asymmetric gated finFET diode 806 that includes the substrate 816 employing a P-type well region 838 and a fin 840 disposed in the direction D. Additionally, the negative surge diode 806 employs first source/drain regions 842(1)-842(3), each of which has the first length L1 in the direction D. Each first source/drain region 842(1)-842(3) employs a P-type doped material (P+) disposed in the fin 840. In this manner, each first source/drain region 842(1)-842(3) functions as an anode of the negative surge diode 806, and thus, is electrically coupled to the ground rail 810. In this aspect, each first source/drain region 842(1)-842(3) also includes a corresponding first spacer 844(1)-844(3) and a corresponding second spacer 846(1)-846(3) similar to the asymmetric gated finFET diode 300 of FIGS. 3A-3C. Additionally, in this aspect, the negative surge diode 806 also includes a bulk doped plug 848(1)-848(3) disposed in the P-type well region 838 and under each corresponding first source/drain region 842(1)-842(3). More specifically, each bulk doped plug 848(1)-848(3) includes the P-type doped material (P+). Thus, each bulk doped plug 848(1)-848(3) adds conductive area to the corresponding first source/drain region 842(1)-842(3), which reduces resistance corresponding to each first source/drain region 842(1)-842(3).

With continuing reference to FIG. 8C, the negative surge diode 806 also includes second source/drain regions 850(1), 850(2), each of which has the second length L2 in the direction D. Each second source/drain region 850(1), 850(2) employs an N-type doped material (N+) disposed in the fin 840. In this manner, each second source/drain region 850(1), 850(2) functions as a cathode of the negative surge diode 806, and thus, is electrically coupled to the node 814. In this aspect, each second source/drain region 850(1), 850(2) also includes a corresponding first spacer 852(1), 852(2) and a corresponding second spacer 854(1), 854(2).

With continuing reference to FIG. 8C, the negative surge diode 806 includes gate regions 856(1)-856(6) having the third length L3 in the direction D. The gate regions 856(2)-856(5) are disposed between corresponding first source/drain regions 842(1)-842(3) and second source/drain regions 850(1), 850(2). For example, the gate region 856(2) is disposed between the first source/drain region 842(1) and the second source/drain region 850(1). The gate region 856(3) is disposed between the first source/drain region 842(2) and the second source/drain region 850(1). Further, the gate region 856(4) is disposed between the first source/drain region 842(2) and the second source/drain region 850(2). The gate region 856(5) is disposed between the first source/drain region 842(3) and the second source/drain region 850(2). In this example, the gate regions 856(1)-856(6) are not electrically coupled to another circuit element (i.e., floating).

The elements described herein are sometimes referred to as means for achieving a particular property. In this regard, the substrate 302 is sometimes referred to herein as "a means for providing a substrate comprising a first-type well region and a fin disposed in a direction." Additionally, the first source/drain region 308 is sometimes referred to herein as "a means for providing a first source/drain region having a first length in the direction, wherein the first source/drain region comprises a first-type doped material disposed in the fin." The second source/drain region 320 is sometimes referred to herein as "a means for providing a second source/drain region having a second length in the direction that is larger than the first length, wherein the second source/drain region comprises a second-type doped material disposed in the fin." Further, the gate region 332(1) is sometimes referred to herein as "a means for providing a gate region formed between the first source/drain region and the second source/drain region having a third length in the direction that is larger than the first length and larger than the second length."

The asymmetric gated finFET diodes according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
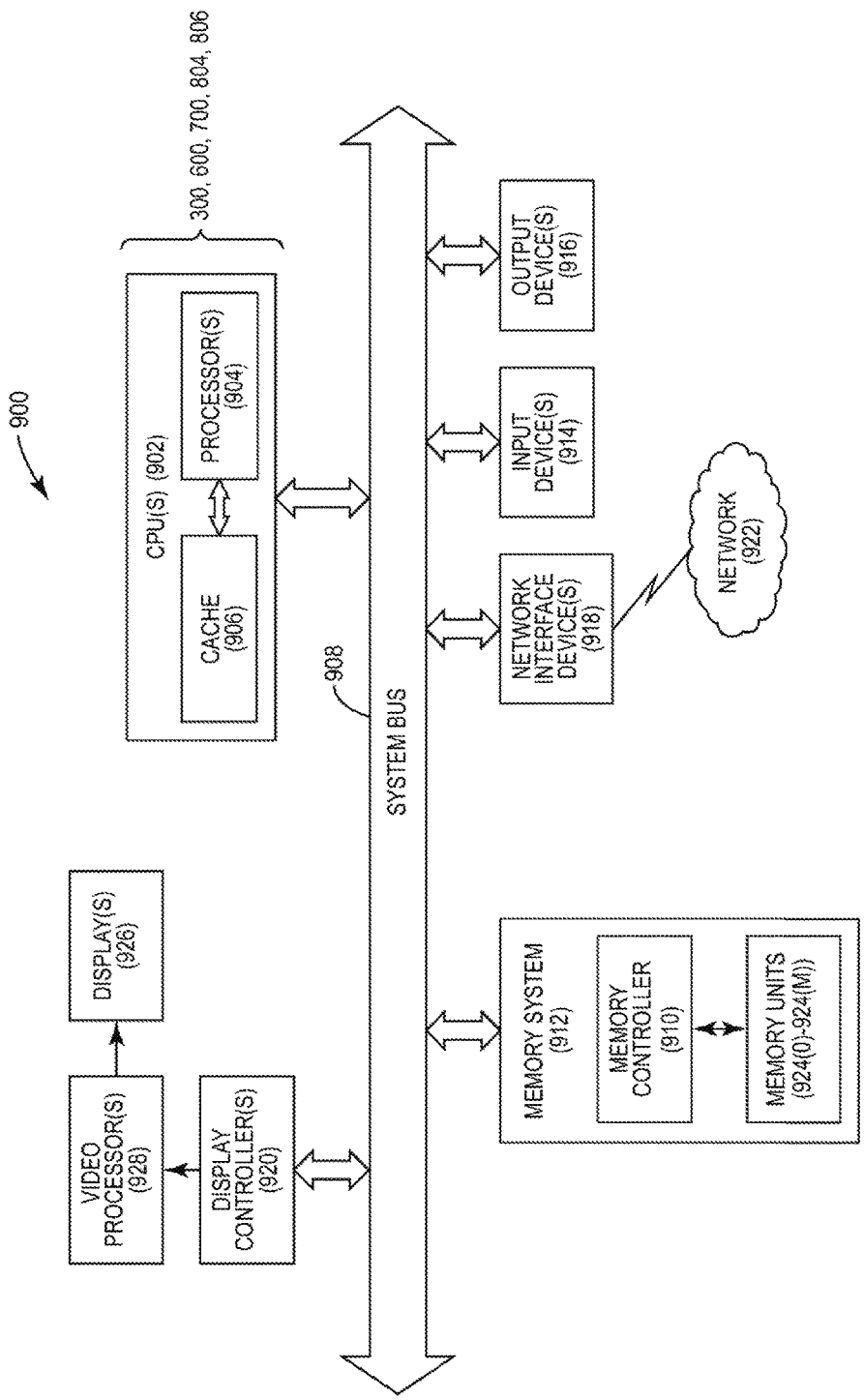
FIG. 9 is a block diagram of an exemplary processor-based system that can include the asymmetric gated finFET diodes of FIGS. 3, 6, 7, 8B, and 8C.

In this regard, FIG. 9 illustrates an example of a processor-based system 900 that can employ elements that include the asymmetric gated finFET diodes 300, 600, 700, 804, and 806 illustrated in FIGS. 3A-3C, 6, 7, 8B, and 8C, respectively. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 912, one or more input devices 914, one or more output devices 916, one or more network interface devices 918, and one or more display controllers 920, as examples. The input device(s) 914 can include any type of input device, including, but not limited to, input keys, switches, voice processors, etc. The output device(s) 916 can include any type of output device, including, but not limited to, audio, video, other visual indicators, etc. The network interface device(s) 918 can be any device configured to allow exchange of data to and from a network 922. The network 922 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 918 can be configured to support any type of communications protocol desired. The memory system 912 can include one or more memory units 924(0)-924(M).

The CPU(s) 902 may also be configured to access the display controller(s) 920 over the system bus 908 to control information sent to one or more displays 926. The display controller(s) 920 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An asymmetric gated fin Field Effect Transistor (FET) (finFET) diode, comprising:
    a substrate comprising:
        a first-type well region; and
        a fin disposed in a direction, the fin comprising:
            a first source/drain region having a first length in the direction, wherein, within the first length, the first source/drain region comprises a first-type doped material disposed in the fin and extending in the direction from a first side to a second side of the first-type doped material;
            a second source/drain region having a second length in the direction that is larger than the first length, wherein, within the second length, the second source/drain region comprises a second-type doped material disposed in the fin and extending in the direction from a first side to a second side of the second-type doped material; and
            a gate region disposed between the first source/drain region and the second source/drain region having a third length in the direction that is equal to the second length plus a difference of the second length and the first length.

2. The asymmetric gated finFET diode of claim 1, wherein:

the first source/drain region further comprises:
  a first spacer disposed over the fin and on the first side of the first-type doped material; and
  a second spacer disposed over the fin and on the second side of the first-type doped material;
the second source/drain region further comprises:
  a first spacer disposed over the fin and on the first side of the second-type doped material; and
  a second spacer disposed over the fin and on the second side of the second-type doped material; and
the gate region further comprises a gate disposed over the fin.

3. The asymmetric gated finFET diode of claim 1, wherein the gate region comprises:
  a first spacer disposed over the fin and adjacent to the first source/drain region; and
  a second spacer disposed over the fin and adjacent to the second source/drain region.

4. The asymmetric gated finFET diode of claim 1, wherein:
  the first-type well region comprises an N-type well region;
  the first-type doped material of the first source/drain region comprises an N-type doped material; and
  the second-type doped material of the second source/drain region comprises a P-type doped material.

5. The asymmetric gated finFET diode of claim 1, wherein:
  the second source/drain region comprises an anode; and
  the first source/drain region comprises a cathode.

6. The asymmetric gated finFET diode of claim 1, wherein:
  the first-type well region comprises a P-type well region;
  the first-type doped material of the first source/drain region comprises a P-type doped material; and
  the second-type doped material of the second source/drain region comprises an N-type doped material.

7. The asymmetric gated finFET diode of claim 6, wherein:
  the second source/drain region comprises a cathode; and
  the first source/drain region comprises an anode.

8. The asymmetric gated finFET diode of claim 1, wherein the first length is approximately equal to a ground rule minimum length.

9. The asymmetric gated finFET diode of claim 1, further comprising a bulk doped plug disposed in the first-type well region and under the first source/drain region, wherein the bulk doped plug comprises the first-type doped material.

10. The asymmetric gated finFET diode of claim 1, further comprising:
  a plurality of first source/drain regions, wherein each first source/drain region has the first length in the direction and comprises the first-type doped material disposed in the fin;
  a plurality of second source/drain regions, wherein each second source/drain region has the second length in the direction and comprises the second-type doped material disposed in the fin; and
  a plurality of gate regions, wherein each gate region is formed between a corresponding second source/drain region and a corresponding first source/drain region and has the third length in the direction.

11. An asymmetric gated fin Field Effect Transistor (FET) (finFET) diode, comprising:
  a means for providing a substrate comprising:
    a first-type well region; and
    a fin disposed in a direction;
  a means for providing a first source/drain region having a first length in the direction, wherein, within the first length, the first source/drain region comprises a first-type doped material disposed in the fin and extending in the direction from a first side to a second side of the first-type doped material;
  a means for providing a second source/drain region having a second length in the direction that is larger than the first length, wherein, within the second length, the second source/drain region comprises a second-type doped material disposed in the fin and extending in the direction from a first side to a second side of the second-type doped material; and
  a means for providing a gate region disposed between the first source/drain region and the second source/drain region having a third length in the direction that is equal to the second length plus a difference of the second length and the first length.

12. A method of manufacturing an asymmetric gated fin Field Effect Transistor (FET) (finFET) diode, comprising:
  providing a substrate comprising a first-type well region and a fin disposed in a direction;
  forming a gate region corresponding to the fin, wherein the gate region has a third length in the direction;
  disposing a first-type doped material in a first source/drain region in the fin, wherein the first source/drain region has a first length in the direction smaller than the third length, the first source/drain region extending in the direction from a first side to a second side of the first-type doped material; and
  disposing a second-type doped material in a second source/drain region in the fin, wherein the second source/drain region has a second length in the direction larger than the first length and smaller than the third length, the second source/drain region extending in the direction from a first side to a second side of the second-type doped material, wherein the gate region is disposed between the first source/drain region and the second source/drain region and wherein the third length is equal to the second length plus a difference of the second length and the first length.

13. The method of claim 12, wherein:
  providing the substrate comprises providing the substrate comprising an N-type well region and the fin;
  disposing the first-type doped material comprises disposing an N-type doped material in the first source/drain region in the fin; and
  disposing the second-type doped material comprises disposing a P-type doped material in the second source/drain region in the fin.

14. The method of claim 12, wherein:
  providing the substrate comprises providing the substrate comprising a P-type well region and the fin;
  disposing the first-type doped material comprises disposing a P-type doped material in the first source/drain region in the fin; and
  disposing the second-type doped material comprises disposing an N-type doped material in the second source/drain region in the fin.

15. An apparatus, comprising:
  an electrostatic discharge (ESD) protection circuit, comprising:
    a positive surge asymmetric gated fin Field Effect Transistor (FET) (finFET) diode coupled to a signal pin and a voltage rail, comprising:
      a substrate comprising:
        an N-type well region; and a fin disposed in a direction;
a first source/drain region having a first length in the direction, wherein the first source/drain region of the positive surge asymmetric gated finFET diode comprises an N-type doped material disposed in the fin and extending in the direction from a first side to a second side of the N-type doped material;
a second source/drain region having a second length in the direction that is larger than the first length, wherein the second source/drain region of the positive surge asymmetric gated finFET diode comprises a P-type doped material disposed in the fin and extending in the direction from a first side to a second side of the P-type doped material; and
a gate region disposed between the second source/drain region and the first source/drain region of the positive surge asymmetric gated finFET diode and having a third length in the direction that is equal to the second length plus a difference of the second length and the first length; and
a negative surge asymmetric gated finFET diode coupled to the signal pin and a ground rail, comprising:
the substrate comprising:
a P-type well region; and
a fin disposed in the direction;
a first source/drain region having the first length in the direction, wherein the first source/drain region of the negative surge asymmetric gated finFET diode comprises a P-type doped material disposed in the fin;
a second source/drain region having the second length in the direction, wherein the second source/drain region of the negative surge asymmetric gated finFET diode comprises an N-type doped material disposed in the fin; and
a gate region disposed between the second source/drain region and the first source/drain region of the negative surge asymmetric gated finFET diode and having the third length in the direction.

16. The apparatus of claim 15, wherein the third length is approximately equal to the second length plus a difference of the second length and the first length.

17. The apparatus of claim 15, wherein:
the second source/drain region of the positive surge asymmetric gated finFET diode comprises an anode;
the first source/drain region of the positive surge asymmetric gated finFET diode comprises a cathode;
the second source/drain region of the negative surge asymmetric gated finFET diode comprises a cathode; and
the first source/drain region of the negative surge asymmetric gated finFET diode comprises an anode.

18. The apparatus of claim 15, wherein the first length is approximately equal to a ground rule minimum length.

19. The apparatus of claim 15, wherein:
the positive surge asymmetric gated finFET diode further comprises a bulk doped plug disposed in the N-type well region and under the first source/drain region of the positive surge asymmetric gated finFET diode, wherein the bulk doped plug comprises the N-type doped material; and
the negative surge asymmetric gated finFET diode comprises a bulk doped plug disposed in the P-type well region and under the first source/drain region of the negative surge asymmetric gated finFET diode, wherein the bulk doped plug comprises the P-type doped material.

* * * * *